(12) United States Patent
Yoshizawa

(10) Patent No.: US 9,190,954 B2
(45) Date of Patent: Nov. 17, 2015

(54) ELECTRONIC DEVICE, METHOD FOR PRODUCING THE SAME, AND OSCILLATOR

(71) Applicant: SEIKO EPSON CORPORATION, Tokyo (JP)

(72) Inventor: Takahiko Yoshizawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/219,694

(22) Filed: Mar. 19, 2014

(65) Prior Publication Data

US 2014/0292430 A1 Oct. 2, 2014

(30) Foreign Application Priority Data

Mar. 28, 2013 (JP) ................ 2013-068254

(51) Int. Cl.
*H03B 5/30* (2006.01)
*H01L 21/768* (2006.01)
*B81C 1/00* (2006.01)
*H03B 5/32* (2006.01)

(52) U.S. Cl.
CPC .............. *H03B 5/30* (2013.01); *B81C 1/00246* (2013.01); *B81C 1/00801* (2013.01); *H01L 21/76802* (2013.01); *B81C 2201/014* (2013.01); *B81C 2203/0742* (2013.01); *B81C 2203/0764* (2013.01); *H03B 5/32* (2013.01)

(58) Field of Classification Search
CPC .. B81C 1/00801; B81C 1/00246; B81B 7/02; B81B 7/0032; B81B 7/0058; B81B 2207/11; H03H 9/2405; H03B 1/02; H03B 5/30; H03B 2200/0022; H03B 2200/0014; H03L 1/04

USPC ....... 331/154, 156, 158, 116 M, 68; 333/186, 333/197, 200; 257/415; 438/50
See application file for complete search history.

(56) References Cited

U.S. PATENT DOCUMENTS

| | | | |
|---|---|---|---|
| 7,923,345 B2 | 4/2011 | Sonsky et al. | |
| 7,994,594 B2 | 8/2011 | Inaba et al. | |
| 8,026,120 B2 | 9/2011 | Kihara et al. | |
| 8,129,804 B2 | 3/2012 | Inaba et al. | |
| 2011/0306153 A1 | 12/2011 | Kihara et al. | |
| 2012/0127683 A1 | 5/2012 | Inaba et al. | |
| 2012/0248615 A1* | 10/2012 | Chien et al. | ............ 257/770 |
| 2014/0231937 A1* | 8/2014 | Losa et al. | ............ 257/415 |

FOREIGN PATENT DOCUMENTS

| | | |
|---|---|---|
| JP | A-9-102589 | 4/1997 |
| JP | A-2006-297502 | 11/2006 |
| JP | A-2008-221435 | 9/2008 |
| JP | A-2009-83018 | 4/2009 |
| JP | A-2009-521127 | 5/2009 |
| JP | A-2009-164372 | 7/2009 |
| JP | A-2010-162629 | 7/2010 |
| WO | WO 2007-072406 A | 6/2007 |
| WO | WO 2013061313 A1 * | 5/2013 |

* cited by examiner

*Primary Examiner* — Ryan Johnson
(74) *Attorney, Agent, or Firm* — Oliff PLC

(57) ABSTRACT

An electronic device according to an aspect of the invention include: a substrate; an underlayer having an opening and being formed on the substrate; a functional element provided on the underlayer; and a surrounding wall forming a cavity that accommodates the functional element, at least a part of the surrounding wall being disposed in the opening.

12 Claims, 7 Drawing Sheets

ELECTRONIC DEVICE, METHOD FOR PRODUCING THE SAME, AND OSCILLATOR

The entire disclosure of Japanese Patent Application No. 2013-068254, filed Mar. 28, 2013 is expressly incorporated by reference herein.

BACKGROUND

1. Technical Field

The present invention relates to an electronic device, a method for producing the same, and an oscillator.

2. Related Art

Electronic devices in which a functional element such as a MEMS (Micro Electro Mechanical Systems) is disposed in a cavity formed on a substrate are known. For example, JP-A-2008-221435 describes an electronic device in which a functional element is formed on a substrate. The electronic device described in JP-A-2008-221435 is produced by forming a functional element on a substrate, forming an interlayer insulating layer so as to cover the functional element, and removing (release etching) the interlayer insulating layer located around the functional element to form a cavity.

With the recent progress in the micronization of electronic devices, the sizes of vias, contacts, guard rings and so forth are becoming very small. When a cavity as that of the electronic device described in JP-A-2008-221935 above is formed using a thin guard ring or the like, the side wall tends to collapse during release etching, so that the interlayer insulating layer may be removed in a region that is not supposed to be removed. This leads to a small margin in the time management for release etching. Also, there is a concern that the mechanical strength is insufficient because of the thin side wall.

When a transistor is additionally formed on the same substrate, it is necessary to interpose a titanium layer between the transistor and a contact in order to improve the junction therebetween. When a side wall that covers the cavity and the contact are formed in the same process, a titanium layer is formed on the side wall. Accordingly, the titanium layer is etched during release etching, so that the interlayer insulating layer may be removed in a region that is not supposed to be removed.

SUMMARY

An advantage of some aspects of the invention is to provide a highly reliable electronic device that is easy to be release etched and has excellent mechanical strength in which a functional element is disposed in a cavity formed on a substrate, an oscillator, and a method for producing the electronic device.

The advantage of some aspects of the invention can be implemented in the form of the following embodiments or application examples.

Application Example 1

An electronic device according to an aspect of the invention includes: a substrate; an underlayer having an opening and being formed on the substrate; a functional element provided on the underlayer; and a surrounding wall forming a cavity that accommodates the functional element, at least a part of the surrounding wall being disposed in the opening.

In the electronic device according to the present application example, a part of the surrounding wall is disposed so as to be embedded in the opening of the underlayer. This allows the surrounding wall to be fitted into the underlayer that will become a base, thus increasing the mechanical strength of the member forming the cavity. Furthermore, this makes it possible to provide a long path for the etchant to leak during release etching, thus providing a large process margin (time margin) during release etching and hence facilitating the production.

Application Example 2

In Application Example 1, the opening may extend through the underlayer, the substrate may include a recessed portion at a position corresponding to the opening of the underlayer, and at least a part of the surrounding wall may be disposed in the recessed portion.

In the electronic device according to the present application example, a part of the surrounding wall is disposed so as to be embedded in the recessed portion of the substrate. This further increases the mechanical strength of the surrounding wall, thereby making it possible to provide a longer path for the etchant to leak during release etching.

Application Example 3

In Application Examples 1 or 2, the surrounding wall may have a lower surface made of a material containing titanium.

In the electronic device according to the present application example, the portion composed of titanium is disposed at a position away from the portion that will become the cavity. Thus, the etchant does not easily come into contact with the portion susceptible to erosion by the etchant during release etching. This can reduce the possibility of leakage of the etchant.

Application Example 4

In any one of Application Examples 1 to 3, the lower surface of the surrounding wall may have an asperity.

In the electronic device according to the present application example, the mechanical strength of the surrounding wall is further increased, and a longer path for the etchant to leak during release etching can be provided.

Application Example 5

A method for producing an electronic device according to an aspect of the invention includes: forming an underlayer on a substrate; forming a functional element on the underlayer; forming a transistor on the substrate; forming a first insulating layer that covers the functional element and the transistor; forming a corrosion-resistant layer that covers the first insulating layer; removing the corrosion-resistant layer on the underlayer; forming a second insulating layer that covers the corrosion-resistant layer and the first insulating layer; etching the second insulating layer to expose the corrosion-resistant layer above the transistor and etching the second insulating layer and the first insulating layer, thereby exposing the underlayer in a shape surrounding at least a part of the functional element; etching the exposed corrosion-resistant layer to expose the first insulating layer on the transistor and etching the exposed underlayer, thereby forming an opening in the underlayer; removing the first insulating layer on the transistor; and forming a conductive layer on the transistor and the opening.

With the production method according to the present application example, it is possible to provide a large process margin (time margin) during etching (release etching) of the first insulating layer for forming the cavity. Moreover, it is possible to produce a highly reliable electronic device having excellent mechanical strength.

Application Example 6

In Application Example 5, in the forming of an opening in the underlayer, the opening may be caused to extend through the exposed underlayer and forming a recessed portion in the substrate at a position corresponding to the opening may be further included, and in the forming of a conductive layer on the transistor and the opening, the conductive layer may be formed on the recessed portion.

With the method for producing an electronic device according to the present application example, the mechanical strength of the surrounding wall is further increased. Also, it is possible to produce an electronic device having a longer path for the etchant to leak during release etching.

Application Example 7

In Application Example 5 or 6, the forming of the conductive layer may include forming a titanium layer.

With the method for producing an electronic device according to the preset application example, it is possible to produce an electronic device including contacts having good conductivity. Also, the titanium layer is formed at a position away from the cavity. Accordingly, the titanium layer does not easily come into contact with the etchant during release etching. This can reduce the possibility of leakage of the etchant.

Application Example 8

An oscillator according to an aspect of the invention includes the electronic device according to any one of Application Examples 1 to 4, further including a circuit unit that drives the functional element. In the oscillator according to the present application example, the functional element is disposed in the cavity having good mechanical strength. Thus, the oscillator according to the present application example is highly reliable. Furthermore, this makes it possible to provide a long path for the etchant to leak during release etching, thus providing a large process margin (time margin) during release etching and hence facilitating the production.

As used herein, the term "above" used in, for example, the phrase "a specific object (hereinafter referred to as 'B') is formed 'above' another specific object (hereinafter referred to as 'A')" is used to include both a case where B is directly formed on A and a case where B is formed above A via still another object.

DESCRIPTION OF EXEMPLARY EMBODIMENTS

The following describes some embodiments of the invention. The embodiments described below illustrate examples of the invention. The invention is by no means limited to the following embodiments, and also encompasses various modified embodiments that can be implemented without departing from the spirit or essential characteristics thereof. It should be appreciated that not all the components described below are necessarily essential to the invention.

1. Electronic Device 1.1. Electronic Device

Figure 1:
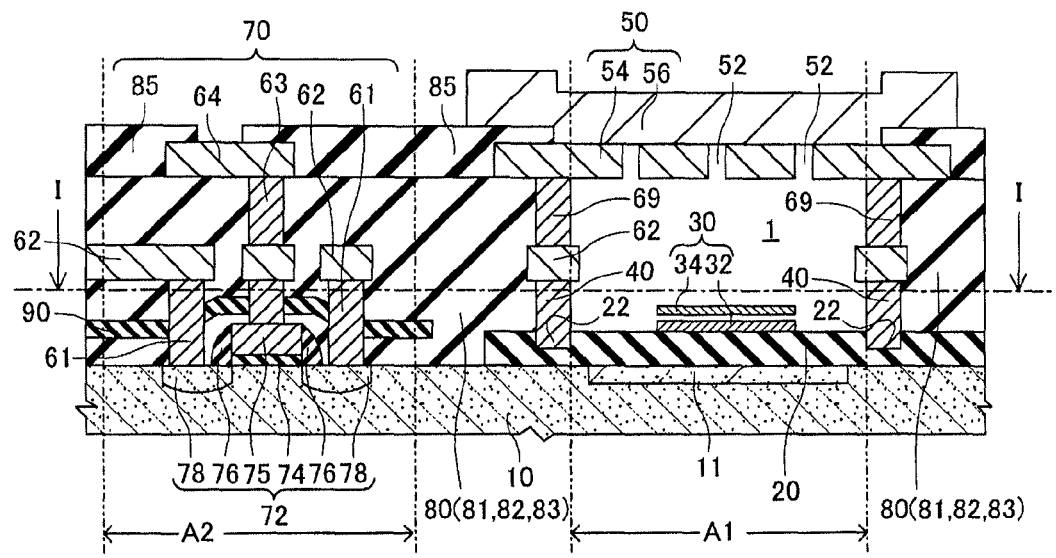
FIG. 1 is a schematic cross section of an electronic device 100 according to an embodiment.
Figure 2:
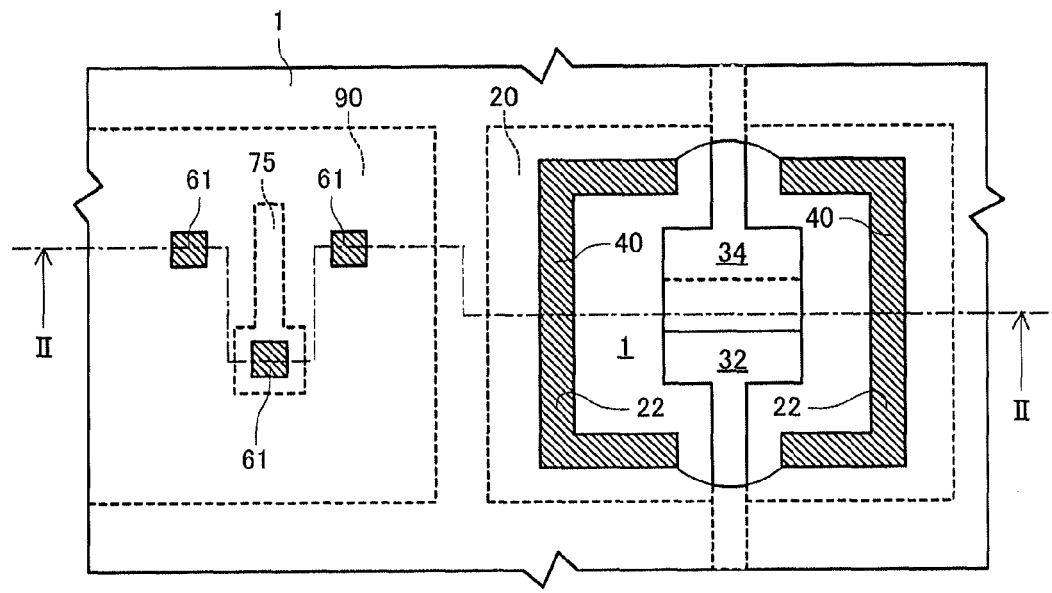
FIG. 2 is a schematic cross section of the electronic device 100 according to an embodiment.

An electronic device according to an embodiment of the invention will be described with reference to the drawings. FIG. 1 schematically shows a cross section of an electronic device 100 according to the present embodiment. FIG. 2 is a cross-sectional view schematically showing the electronic device 100 according to the present embodiment. FIG. 1 corresponds to a cross section taken along the line II-II in FIG. 2. FIG. 2 corresponds to a cross section taken along the line I-I in FIG. 1.

As shown in FIGS. 1 and 2, the electronic device 100 includes a substrate 10, an underlayer 20, a functional element 30, and a surrounding wall 40 forming a cavity 1 that accommodates the functional element 30.

The substrate 10 includes a first region A1 in which the cavity 1 that accommodates the functional element 30 is formed. As the substrate 10, a semiconductor substrate such as a silicon (Si) substrate can be used, for example. Various substrates such as a ceramic substrate, a glass substrate, a sapphire substrate, and a synthetic resin substrate may also be used as the substrate 10. The thickness of the substrate 10 is, for example, 100 µm to 400 µm. A trench insulating layer, a LOCOS (Local Oxidation of Silicon) insulating layer, a semi-recessed LOCOS insulating layer, or the like may be formed in the substrate 10. Also, an STI (Shallow Trench Isolation) 11 as shown may be formed in the substrate 10.

The underlayer 20 is formed on the substrate 10. The underlayer 20 is formed in a region that extends, in plan view, outside of at least the first region A1 in which the cavity 1 is formed and the surrounding wall 40. Examples of the material of the underlayer 20 include silicon nitride (SiN) and silicon oxynitride (SiON). The thickness of the underlayer 20 is, for example, 0.1 µm or more and 50 µm or less, preferably 0.5 µm or more and 30 µm or less, more preferably 1 µm or more and 20 µm or less. The underlayer 20 is capable of functioning as an etching stopper in forming the cavity 1. The underlayer 20 constitutes a part of the member forming the cavity 1.

The underlayer 20 has an opening 22. The opening 22 is formed so as to surround the functional element 30 in plan view. Since a part of the surrounding wall 40 is disposed in the opening 22, the shape in which the opening 22 surrounds the functional element 30 may include, for example, a cut for allowing passage of the interconnect of the functional element 30. Although the opening 22 is formed in a straight-line shape in plan view in the example shown in FIG. 2, the opening 22 may be formed in a bent-line or curved-line shape in plan view. There is no particular limitation on the width and the depth of the opening 22. However, since the surrounding wall 40 is disposed in the opening 22, the opening 22 preferably has a width and a depth that allow the surrounding wall 40 to be embedded therein during the formation of the surrounding wall 40. In addition, the depth of the opening 22 is preferably as deep as possible from the viewpoints of preventing leakage of the etchant during release etching and disposing a point vulnerable to the etchant in a farther location. Specifically, the width of the opening 22 is 0.1 µm or more and 10 µm or less, preferably 0.2 µm or more and 5 µm or less, more preferably 0.5 µm or more and 5 µm or less, particularly preferably 0.5 µm or more and 3 µm or less. Specifically, the depth of the opening 22 is 0.1 µm or more and 10 µm or less, preferably 0.2 µm or more and 5 µm or less, more preferably 0.5 µm or more and 5 µm or less, particularly preferably 0.5 µm or more and 3 µm or less. As will be described later in the section of modifications, the opening 22 may extend through the underlayer 20. At least a part of the surrounding wall 40 is disposed in the opening 22.

The surrounding wall 40 is disposed above the substrate 10, and constitutes a part of the side wall that forms the cavity 1. In the example shown in FIG. 1, the surrounding wall 40 is located in the opening 22 on the underlayer 20, and is formed in a shape surrounding the cavity 1 and overlaps the opening 22 in plan view. The surrounding wall 40 functions as a part of the side wall that defines the cavity 1. The surrounding wall 40 may constitute the entire side wall that defines the cavity 1.

Although the surrounding wall 40 is formed in a straight-line shape in plan view in the example shown in FIG. 2, the surrounding wall 40 may be formed in a bent-line or curved-line shape in plan view. The surrounding wall 40 can also be regarded as a guard ring.

As shown in FIG. 2, the surrounding wall 40 is disposed so as to surround the functional element 30. However, the surrounding wall 40 does not need to surround the entire perimeter of the functional element 30, and a gap may exist as shown. There is no particular limitation on the planar shape of the surrounding wall 40, as long as the surrounding wall 40 surrounds at least a part of the functional element 30. The surrounding wall 40 may be electrically connected to the components thereround. The thickness of the surrounding wall 40 is 0.1 µm or more and 10 µm or less, preferably 0.2 µm or more and 5 µm or less, more preferably 0.5 µm or more and 5 µm or less, particularly preferably 0.5 µm or more and 3 µm or less.

Examples of the material of the surrounding wall 40 include metals such as copper (Cu), tungsten (W) and titanium (Ti), and alloys thereof. The material of the surrounding wall 40 may be W or Cu, or an alloy thereof. When Cu or an alloy thereof is used as the material, the surrounding wall 40 can be formed, for example, by a single damascene method, a dual damascene method, or the like. This may improve the productivity.

The surrounding wall 40 may be formed of a material containing titanium. For example, disposing the titanium-containing layer on the lower surface of the surrounding wall 40 makes it possible to clean portions of contact between the surrounding wall 40 and the opening 22. In the case of performing the formation of the surrounding wall 40 and the formation of a contact 61 of a transistor 72 in the same process when a transistor 72 is formed on the substrate 10, disposing the titanium-containing layer on the lower surface of the contact 61 (the lower surface of the surrounding wall 40) can achieve good adhesion. In the case of providing the surrounding wall 40 with a titanium layer, it is more preferable to provide the titanium layer on the lower surface of the surrounding wall 40 to minimize the contact area between titanium metal and the cavity 1.

At least a part of the surrounding wall 40 is provided in the opening 22 of the underlayer 20. The depth in which the surrounding wall 40 is embedded in the opening 22 is not particularly limited, but is preferably as large as possible. The depth in which the surrounding wall 40 is embedded (i.e., the depth of the opening 22) is, for example, 0.1 µm or more and 5 µm or less, preferably 0.2 µm or more and 4 µm or less, more preferably 0.3 µm or more and 3 µm or less.

The electronic device 100 according to the present embodiment includes a lid member 50. The lid member 50 is disposed above the surrounding wall 40, and formed so as to cover the cavity 1. As shown, the lid member 50 may be formed above the surrounding wall 40 via another member. The lid member 50 may be composed of a single member, but may be composed of a member having through-holes 52 and a member for sealing the through-holes 52 of the member having the through-holes 52. When the lid member 50 is composed of a single member, the electronic device 100 may have other components such as holes for release etching the cavity 1 and a sealing member. In the example shown, the lid member 50 is composed of a first sealing layer 54 having through-holes 52 and a second sealing layer 56 that is stacked on the first sealing layer 54 to seal the through-holes 52.

The first sealing layer 54 has through-holes 52. There is no limitation on the number of the through-holes 52. The first sealing layer 54 can be formed by, for example, an alloy or composite nitride of one or more components selected from the group consisting of Al, Cu, TiN, TaN, Ti, Ta, W, Au, Pt, Co and Ni. The first sealing layer 54 may have a stacked structure of two or more layers. The thickness of the first sealing layer 54 can be, for example, 0.1 µm or more and 10 µm or less.

The second sealing layer 56 is formed on the first sealing layer 54. The second sealing layer 56 is capable of closing the through-holes 52 of the first sealing layer 54. Examples of the material of the second sealing layer 56 include Al, Cu, Ti, and W. When the material of the second sealing layer 56 include a layer made of an alloy of one or more components selected from the group consisting of Al, W and Cu, the mechanical strength for holding the cavity 1 can be enhanced. The thickness of the second sealing layer 56 is, for example, 1 µm or more and 5 µm or less. The first sealing layer 54 and the second sealing layer 56 are capable of functioning as the lid member 50 that covers the cavity 1 from above to seal the cavity 1.

The cavity 1 is a space for accommodating the functional element 30. The cavity 1 is formed in the first region A1 of the substrate 10. In the example shown, the cavity 1 is defined by a configuration including the underlayer 20, the surrounding wall 40, and the lid member 50. The interior of the cavity 1 can be brought into, for example, a depressurized state, thereby making it possible to improve the operating accuracy of the functional element 30.

The functional element 30 is formed on the underlayer 20. Further, the functional element 30 is disposed in the cavity 1. There is no particular limitation on the functional element 30, and any functional element can be used as long as it can be accommodated in the cavity 1. Examples of the functional element 30 include a vibrator, a crystal resonator, a SAW (surface acoustic wave) element, an acceleration sensor, a gyroscope, and a microactuator. Specific examples of the functional element 30 include a vibrator including a fixed electrode 32 formed on the underlayer 20 and a movable electrode 34 formed so as to be spaced from the fixed electrode 32 as shown. The fixed electrode 32 and the movable electrode 34 may be connected to an interconnect layer (not shown). Examples of the material of the fixed electrode 32 and the movable electrode 34 include polycrystalline silicon that has been imparted with conductivity by being doped with a predetermined impurity.

1.2. Other Components

In addition to the above-described components, the electronic device 100 of the present embodiment may include components, including, for example, a circuit unit 70 formed by a transistor 72, an interlayer insulating layer 80, a contact 61, interconnect 62, a via 63, a pad 64, a protective layer 85 and the like, and a guard ring 69.

As shown in FIG. 1, a circuit unit 70 for driving the functional element 30 may be formed on the substrate 10. The circuit unit 70 can be composed of a transistor 72, a capacitor (not shown) and the like. For example, the circuit unit 70 includes a transistor 72. The transistor 72 is formed on the substrate 10. The transistor 72 is, for example, a MOS transistor including a gate insulating film 74, a gate electrode 75, a source or drain region 78, and a side wall 76. In the example shown, interconnect 62 and a via 63 are formed in a second region A2 of the substrate 10. The interconnect 62 and the via 63 may be electrically connected, for example, to other elements (not shown) making up the circuit unit 70.

The gate insulating film 74 of the transistor 72 is formed on the substrate 10. The gate insulating film 74 is made of a silicon oxide layer, for example. The gate insulating film 74 is sandwiched between the substrate 10 and the gate electrode 75. The material of the gate electrode 75 is, for example, polycrystalline silicon that has been imparted with conductivity by being doped with a predetermined impurity. The source or drain region 78 is formed on the substrate 10. The source or drain region 78 is formed by doping the substrate 10 with a predetermined impurity. The side wall 76 is formed laterally to the gate electrode 75. The material of the side wall 76 is, for example, silicon oxide ($SiO_2$), silicon nitride ($Si_3N_4$), or silicon oxynitride (SiON).

In the example shown, the interlayer insulating layer 80 is formed above the substrate 10. In the example shown in FIG. 1, the interlayer insulating layer 80 of the electronic device 100 is illustrated as being continuous, but the interlayer insulating layer 80 may be a stack of a plurality of layers. Examples of the material of the interlayer insulating layer 80 include silicon oxide ($SiO_2$). Note that the cavity 1 corresponds to the region where the interlayer insulating layer 80 has been removed.

The contact 61 is formed on the gate electrode 75 and the source or drain region 78. The material of the contact 61 can be the same as the material of the surrounding wall 40, for example.

The interconnect 62 is formed on the contact 61 and the surrounding wall 40. A portion of the interconnect 62 that is formed on the surrounding wall 40 may be formed around the cavity 1, thus constituting a part of the side wall of the cavity 1 together with the surrounding wall 40. Examples of the material of the interconnect 62 include polycrystalline silicon (Poly-Silicon), metals such as aluminum (Al), copper (Cu) and tungsten (W), and alloys thereof.

The via 63 is formed on the interconnect 62. The via 63 connects the interconnect 62 to the pad 64 to constitute a circuit. The material of the via 63 can be the same as the material of the surrounding wall 40, for example.

The guard ring 69 is formed on a portion of the interconnect 62 that is formed on the surrounding wall 40. The guard ring 69 may be formed around the cavity 1, thus constituting a part of the side wall of the cavity 1 together with the surrounding wall 40. The material of the guard ring 69 may be the same material as the surrounding wall 40, for example.

The pad 64 is formed on the via 63. The material of the pad 64 is, for example, the same material as the material of the first sealing layer 54 of the lid member 50.

The protective layer 85 may be formed on the interlayer insulating layer 80 and the lid member 50, for example. Examples of the material of the protective layer 85 include silicon oxide and silicon nitride. The protective layer 85 is capable of functioning as a passivation layer, for example.

The electronic device 100 may further include a resin layer, a pad, an external terminal, an interconnect layer, a resist layer and the like, which are not shown. The electronic device 100 may have a WCSP structure.

When the surrounding wall 40 seamlessly surrounds the cavity 1 in the electronic device 100 in plan view, the surrounding wall 40 is disposed between the center of the cavity 1 and the transistor 72. However, even in a case where the surrounding wall 40 is partly discontinuous (has a gap) due to, for example, the interconnect of the functional element 30, when the electronic device 100 includes a transistor 72, it is preferable that the surrounding wall 40 is disposed between the center of the cavity 1 and the transistor 72. More specifically, as shown in FIG. 2, it is preferable that the discontinuous part (gap) of the surrounding wall 40 in plan view is located so as to avoid the area between the center of the cavity 1 and the transistor 72. This allows the etchant used for etching during production to be blocked by the surrounding wall 40, thus suppressing the leakage of the etchant in the direction to the transistor 72. It is thus possible, for example, to improve the production yield of the electronic device 100, thereby enhancing productivity.

1.3. Operation and Effect

In the electronic device 100 of the present embodiment, a part of the surrounding wall 40 is disposed so as to be embedded in the opening 22 of the underlayer 20. Accordingly, the surrounding wall 40 is fitted into the underlayer 20 that will become the base, thus improving the mechanical strength of the member forming the cavity 1.

Furthermore, due to a part of the surrounding wall 40 being disposed so as to be embedded in the opening 22 of the underlayer 20, the interface between the surrounding wall 40 and the underlayer 20, which has relatively low corrosion resistance to the etchant during release etching, is formed so as to be bent in cross section. That is, a long path is provided for the etchant to erode the interface between the two components and leak to the outside of the cavity 1 during release etching. Accordingly, a large process margin (time margin) during release etching can be provided, thus facilitating production.

1.4. Modifications

Figure 3:
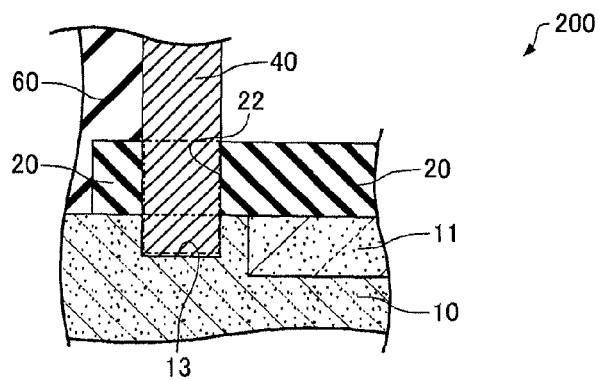
FIG. 3 is a schematic cross section of relevant portions of an electronic device 200 according to a modification.
Figure 4:
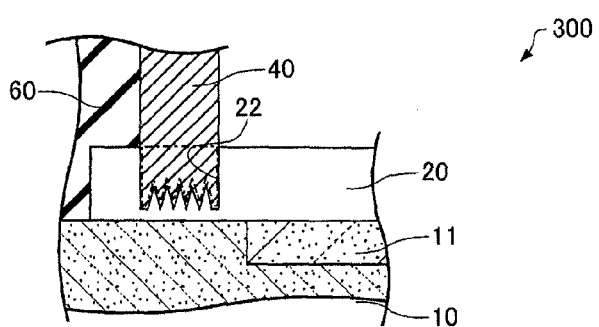
FIG. 4 is a schematic cross section of relevant portions of an electronic device 300 according to a modification.

FIGS. 3 and 4 schematically show an enlarged cross-sectional view of relevant portions of an electronic device 200 and an electronic device 300 according to modifications. FIGS. 3 and 4 show enlarged views of areas in the vicinity of the lower portion of the surrounding wall 40.

The electronic device 200 and the electronic device 300 according to modifications described below are the same as the electronic device 100 described above except for the configuration in the vicinity of the lower portion of the surrounding wall 40. Therefore, the members that are the same as those described above are denoted by the same reference numerals, and the detailed description thereof has been omitted.

In the electronic device 200 according to a modification, the opening 22 formed in the underlayer 20 extends through the underlayer 20 as shown in FIG. 3. Additionally, a recessed portion 13 is formed in the substrate 10 at the position corresponding to the opening 22. Also, the lower portion of the surrounding wall 40 is disposed in the opening 22 and the recessed portion 13. Note that when an STI is formed on the substrate 10 in the electronic device 200, it is preferable that the recessed portion 13 is formed so as to avoid the region in which the STI 11 is formed.

In the electronic device 200, the surrounding wall 40 is fitted deeply into the substrate 10 beyond the underlayer 20 that will become the base, and therefore the mechanical strength of the member forming the cavity 1 is further improved. Additionally, a longer path is provided for the etchant to leak to the outside of the cavity 1 during release etching. Accordingly, a large process margin (time margin) during release etching can be provided, thus facilitating production.

In the case of forming the recessed portion 13 as in the electronic device 200, the recessed portion 13 can be formed by causing the opening 22 to extend through the underlayer 20 by etching in the step of forming an opening 22 of the underlayer 20, and etching the substrate 10 through that opening 22 (using the underlayer 20 as a mask).

Next, in the electronic device 300 according to a modification, an asperity is formed on the lower surface of the surrounding wall 40 as shown in FIG. 4. Although the opening 22 of the underlayer 20 is formed in a shape conforming to the asperity in the example shown, the bottom surface of the recessed portion 13 of the substrate 10 may be formed in a shape conforming to the asperity when the opening 22 extends through the underlayer 20. There is no particular limitation on the size and the shape of the asperity. For example, the asperity may have a dimple shape or a stripe shape, and may have either a regular or irregular shape. Note that hatching of the underlayer 20 is omitted in FIG. 4.

In the electronic device 300, an asperity is formed on the lower surface of the surrounding wall 40, and the contact area between the surrounding wall 40 and the underlayer 20 is increased, resulting in improved adhesion therebetween. Thus, the mechanical strength of the member forming the cavity 1 is further improved. Additionally, the path for the etchant to leak to the outside of the cavity 1 during release etching is longer as compared with the case where the lower surface of the surrounding wall 40 is flat. Accordingly, a large process margin (time margin) during release etching can be provided, thus facilitating production.

In the case of forming an asperity as in the electronic device 300, the asperity can be formed by performing patterning in the step of forming the opening 22 of the underlayer 20, or by using etching residue as a mask.

2. Method for Producing Electronic Device

Next, a method for producing an electronic device will be described with reference to the drawings.

FIGS. 5 to 20 are cross-sectional views schematically showing a part of the production process of an electronic device (the electronic device 100 described above) according to the present embodiment.

The method for producing the electronic device 100 according to the present embodiment includes: forming an underlayer 20 on a substrate 10; forming a functional element 30 on the underlayer 20; forming a transistor 72 on the substrate 10; forming a first insulating layer 81 that covers the functional element 30 and the transistor 72; forming a corrosion-resistant layer 90 that covers the first insulating layer 81; removing the corrosion-resistant layer 90 on the underlayer 20; forming a second insulating layer 82 that covers the corrosion-resistant layer 90 and the first insulating layer 81; etching the second insulating layer 82 to expose the corrosion-resistant layer 90 above the transistor 72 and etching the second insulating layer 82 and the first insulating layer 81, thereby exposing the underlayer 20 in a shape surrounding at least a part of the functional element 30; etching the exposed corrosion-resistant layer 90 to expose the first insulating layer 81 on the transistor 72 and etching the exposed underlayer 20, thereby forming an opening 22 in the underlayer 20; removing the first insulating layer 81 on the transistor 72; and forming a conductive layer on the transistor 72 and the opening 22.

Figure 5:
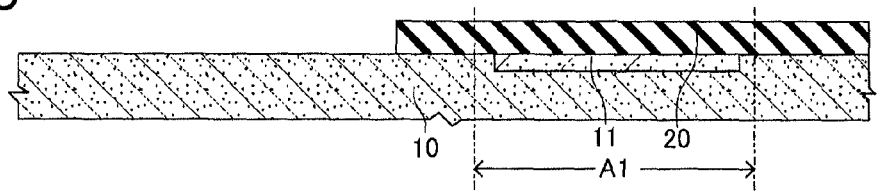
FIG. 5 is a schematic cross section in a step of a method for producing an electronic device according to an embodiment

First, as shown in FIG. 5, an underlayer 20 is formed on a substrate 10. The underlayer 20 is deposited by a CVD (Chemical Vapor Deposition) method or a sputtering method, for example. The underlayer 20 is formed in at least a first region A1 on the substrate 10. The underlayer 20 may be patterned by a photolithography technique and an etching technique as needed.

Figure 6:
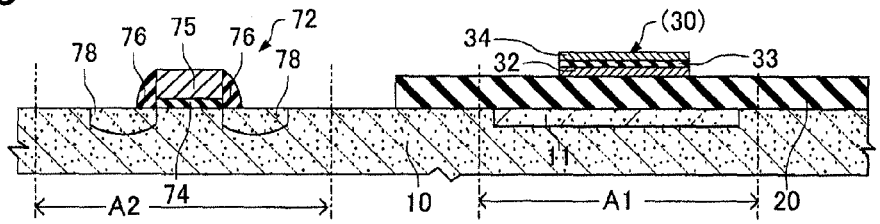
FIG. 6 is a schematic cross section in a step of the method for producing an electronic device according to an embodiment.

Next, as shown in FIG. 6, a fixed electrode 32, a sacrificial layer 33 that covers the fixed electrode 32, and a movable electrode 34 are formed on the underlayer 20. The fixed electrode 32 is formed by depositing a semiconductor layer (not shown) of polycrystalline silicon or the like, for example, by a CVD method or a sputtering method, followed by patterning, for example, by photolithography technique and an etching technique. Then, an impurity such as phosphorus (P) or boron (B) is implanted into the patterned semiconductor layer.

The sacrificial layer 33 is a silicon oxide layer, for example. The sacrificial layer 33 is formed, for example, by thermally oxidizing the fixed electrode 32. The thermal oxidation treatment of the fixed electrode 32 is performed at a temperature of 800° C. or more and 1100° C. or less, for example. In this step, a gate insulating film 74 of a transistor 72 may be formed. The gate insulating film 74 is formed by thermally oxidizing the substrate 10. The relationship between the thickness of the sacrificial layer 33 and the thickness of the gate insulating film 74 can be controlled by adjusting the relationship between the fixed electrode 32 and the substrate 10 in terms of the crystallinity or impurity concentration. Note that the sacrificial layer 33 and the gate insulating film 74 may also be formed by a CVD method or a sputtering method.

The movable electrode 34 is formed, for example, by a CVD method, a sputtering method, and patterning such as a photolithography technique and an etching technique. Then, an impurity is implanted into the movable electrode 34. This makes it possible to impart conductivity to the movable electrode 34. Examples of the impurity to be implanted include phosphorus (P) and boron (B). Additionally, thermal treatment for activating impurity may be performed.

From a stack of the fixed electrode 32, the sacrificial layer 33 and the movable electrode 34 formed in this step, the sacrificial layer 33 is removed in the subsequent release etching, thus forming a functional element 30 composed of the fixed electrode 32 and the movable electrode 34.

Next, a transistor 72 is formed on the substrate 10. This step may be performed simultaneously, or either before or after the step of forming the stack. This step includes the step of forming a gate insulating film 74 in a second region A2, which is different from the first region A1, on the substrate 10, the step of forming a gate electrode 75 on the gate insulating film 74, the step of forming a source or drain region 78 by doping a predetermined region of the substrate 10 with an impurity, and the step of forming a side wall 76. Each of these steps can be performed by a known method.

Figure 7:
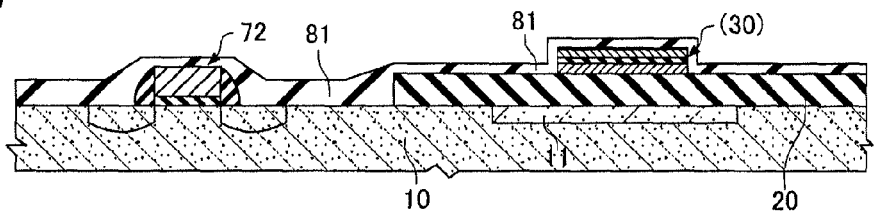
FIG. 7 is a schematic cross section in a step of the method for producing an electronic device according to an embodiment.

Next, as shown in FIG. 7, a first insulating layer 81 that covers the substrate 10, the transistor 72, the underlayer 20, the fixed electrode 32 and the movable electrode 34 is formed. The first insulating layer 81 is formed, for example, by a CVD method or a coating (spin coating) method.

Figure 8:
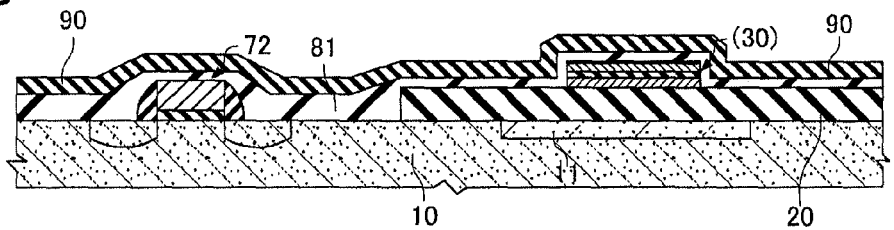
FIG. 8 is a schematic cross section in a step of the method for producing an electronic device according to an embodiment.
Figure 9:
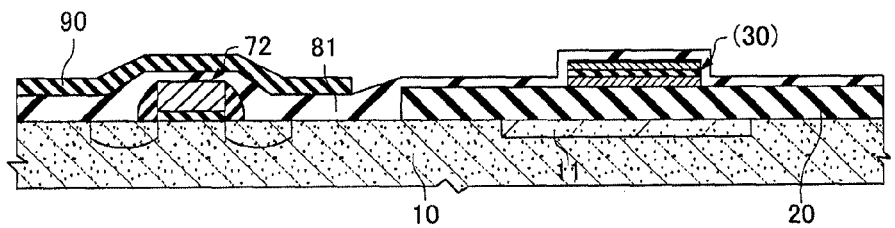
FIG. 9 is a schematic cross section in a step of the method for producing an electronic device according to an embodiment.
Figure 10:
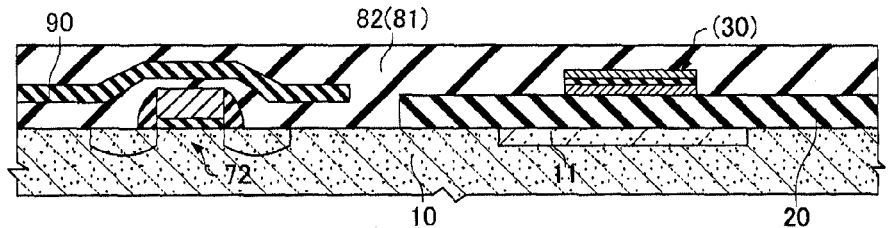
FIG. 10 is a schematic cross section in a step of the method for producing an electronic device according to an embodiment.

Then, as shown in FIG. 8, a corrosion-resistant layer 90 that covers the first insulating layer 81 is formed. The corrosion-resistant layer 90 is made of a material having selectivity to the first insulating layer 81 and the second insulating layer 82 that are formed on top and bottom thereof, including, for example, at least one material selected from the group consisting of silicon nitride, silicon oxynitride, aluminum nitride, aluminum oxide and a composite thereof. The presence of such a corrosion-resistant layer 90 makes it possible to use the corrosion-resistant layer 90 as an etching stopper, thereby facilitating the step of forming an opening 22 in the underlayer 20. The corrosion-resistant layer 90 is formed by a CVD method, a sputtering method, or the like. Then, as shown in FIG. 9, the corrosion-resistant layer 90 located above the underlayer 20 is removed, and a second insulating layer 82 is deposited on the entire surface as shown in FIG. 10. The second insulating layer 82 is formed by, for example, a CVD method, a coating method, or the like.

Next, the second insulating layer 82, the corrosion-resistant layer 90, the first insulating layer 81, and the underlayer 20 are removed by etching to form a space for forming a contact 61 that connects to the gate electrode 75 and the source or drain region 78, and the surrounding wall 40. This step includes the step of etching the second insulating layer 82 to expose the corrosion-resistant layer 90 above the transistor 72 and etching the second insulating layer 82 and the first insulating layer 81, thereby exposing the underlayer 20 in a shape surrounding at least a part of the functional element 30 (FIG. 11), the step of etching the exposed corrosion-resistant layer 90 to expose the first insulating layer 81 on the transistor 72 and etching the exposed underlayer 20, thereby forming an opening 22 in the underlayer 20 (FIG. 12), and the step of removing the first insulating layer 81 on the transistor 72 (FIG. 13).

Figure 11:
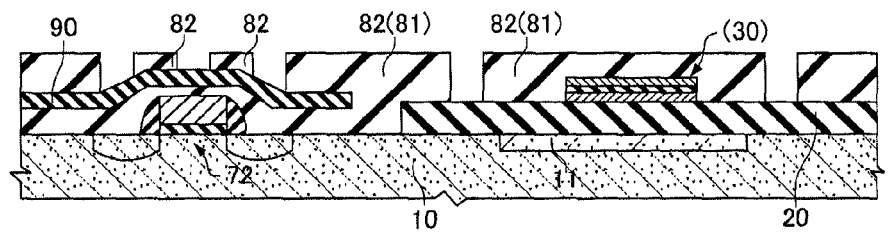
FIG. 11 is a schematic cross section in a step of the method for producing an electronic device according to an embodiment.

Of these steps, in the step of etching the second insulating layer 82 to expose the corrosion-resistant layer 90 above the transistor 72 and etching the second insulating layer 82 and the first insulating layer 81, thereby exposing the underlayer 20 in a shape surrounding at least a part of the functional element 30 shown in FIG. 11, etching may also be performed so as to leave a residue of the insulating layer on the underlayer 20 that is to be exposed. This enables the residue to function as a mask, and thus an asperity can be formed on the bottom portion of the opening 22 by performing the subsequent step of etching the underlayer 20. This makes it possible to more easily produce the electronic device 300 according to the modification described above.

Figure 12:
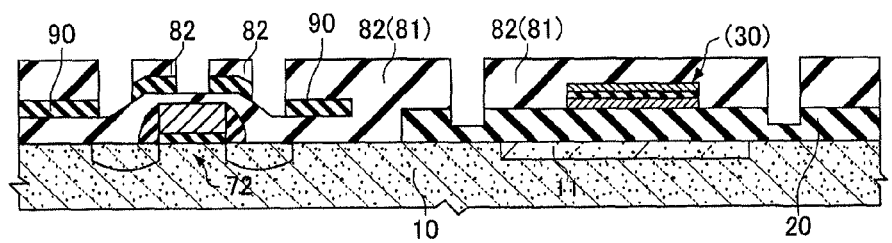
FIG. 12 is a schematic cross section in a step of the method for producing an electronic device according to an embodiment.
Figure 13:
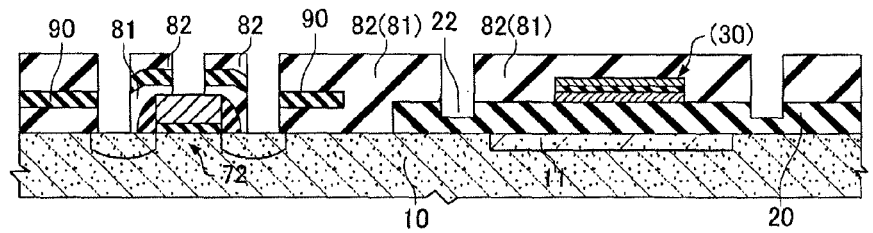
FIG. 13 is a schematic cross section in a step of the method for producing an electronic device according to an embodiment.
Figure 14:
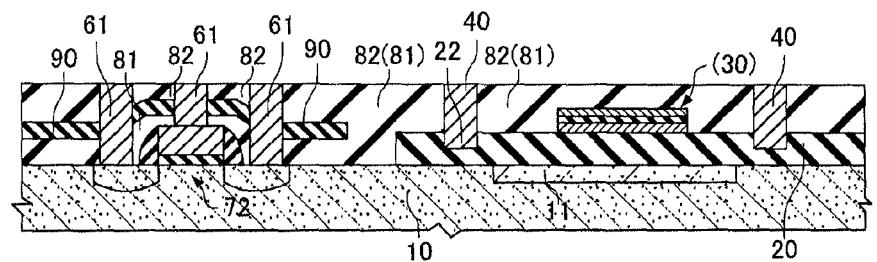
FIG. 14 is a schematic cross section in a step of the method for producing an electronic device according to an embodiment.

Further, in the step of etching the exposed corrosion-resistant layer 90 to expose the first insulating layer 81 on the transistor 72 and etching the exposed underlayer 20, thereby forming an opening 22 in the underlayer 20 shown in FIG. 12, the opening 22 of the underlayer 20 can be formed in a predetermined depth by adjusting the etching time. Setting the etching time to be long in this step enables the opening 22 of the underlayer 20 to extend through the underlayer 20 to the lower surface thereof. Although not shown, etching the substrate 10 using the underlayer 20 as a mask makes it possible to easily produce the electronic device 200 according to the modification described above.

Then, a contact 61 that connects to the gate electrode 75 and the source or drain region 78, and a surrounding wall 40 are formed. This step can be performed by depositing W, Cu, or an alloy thereof by evaporation, sputtering, or the like. In the case of using Cu or an alloy thereof as the material, the contact 61 and the surrounding wall 40 can be formed, for example, by a single damascene method, a dual damascene method, or the like. Additionally, in this step, the lower surfaces of the contact 61 and the surrounding wall 40 may be formed of titanium as needed. In other words, this step may include the step of forming a titanium layer.

Forming a titanium layer on the lower surfaces of the contact 61 and the surrounding wall 40 makes it possible, for example, to cause an impurity such as etching residue to be absorbed by the titanium layer, thus cleaning the interface. Accordingly, it is possible to provide a good electrical connection between the contact 61 and each of the gate electrode 75 and the source or drain region 78. It is also possible to provide a good mechanical connection between the surrounding wall 40 and the underlayer 20 or the substrate 10. In addition, when the step of forming a titanium layer in this manner is adopted, the titanium-containing layer formed will be a layer that is susceptible to etching by release etching. However, even if a titanium layer is formed in each of the electronic device 100 of the present embodiment and the electronic device 200 and the electronic device 300 according to the modifications, the titanium-containing layer on the lower surface of the surrounding wall 40 is formed at a position away from the region that will become the cavity 1 because the surrounding wall 40 is located below the upper surface of the underlayer 20. Thus, even if a titanium-containing layer is formed on the lower surfaces of the contact 61 and the surrounding wall 40 by adopting the step of forming a titanium layer, the electronic device 100 of the present embodiment and the electronic device 200 and the electronic device 300 according to the modifications can sufficiently achieve the above-described effect, thus sufficiently suppressing the leakage of the etchant during release etching.

Figure 15:
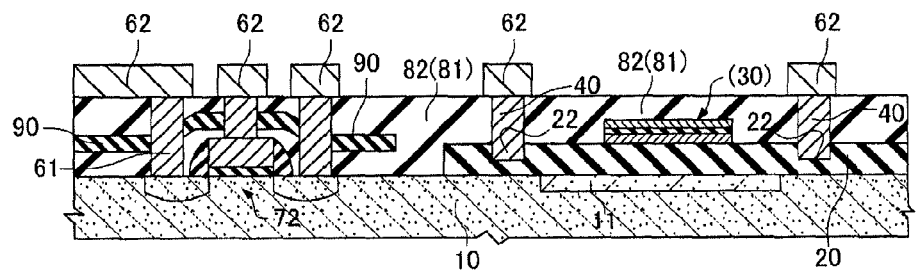
FIG. 15 is a schematic cross section in a step of the method for producing an electronic device according to an embodiment.
Figure 16:
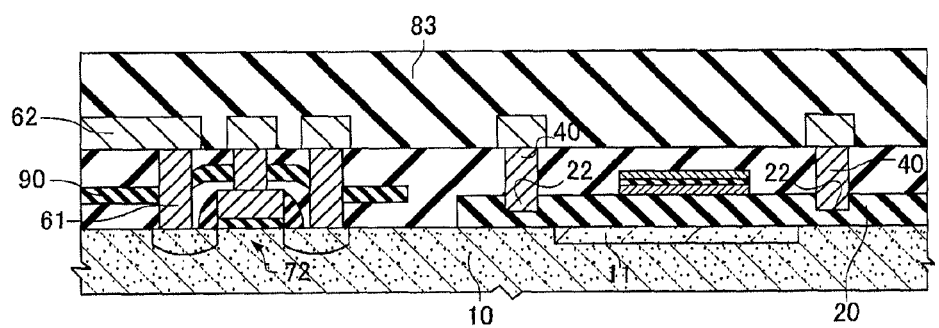
FIG. 16 is a schematic cross section in a step of the method for producing an electronic device according to an embodiment.
Figure 17:
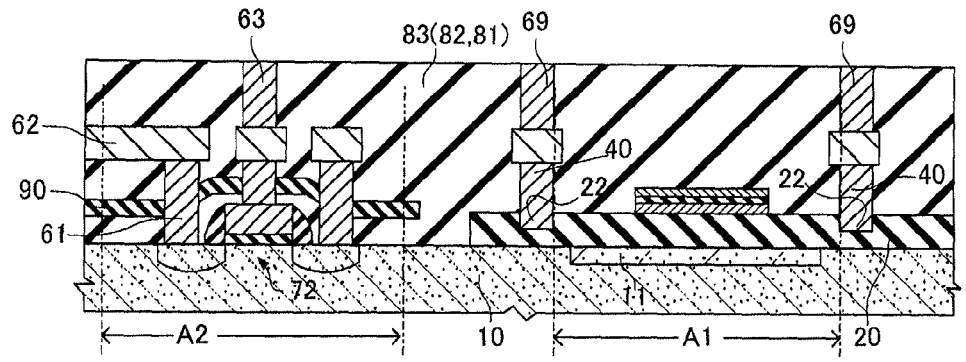
FIG. 17 is a schematic cross section in a step of the method for producing an electronic device according to an embodiment.
Figure 18:
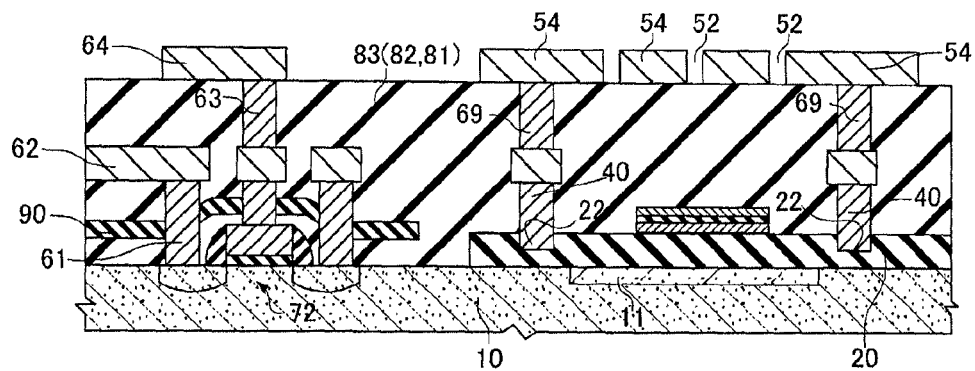
FIG. 18 is a schematic cross section in a step of the method for producing an electronic device according to an embodiment.

Then, as shown in FIG. 15, interconnect 62 that connects to the contact 61 and interconnect 62 that circulates on the surrounding wall 40 along the surrounding wall 40 are formed by sputtering, patterning, or the like. Then, as shown in FIG. 16, a third insulating layer 83 is formed. The third insulating layer 83 can be formed, for example, by a CVD method, a coating method, or the like. Then, as shown in FIG. 17, a via 63 that connects to the interconnect 62 and a guard ring 69 that circulates above the surrounding wall 40 along the surrounding wall 40 are formed. Then, as shown in FIG. 18, a pad 64 and a first sealing layer 54 that covers the first region A1 are formed by sputtering, patterning, or the like. After this step, through-holes 52 that allow the third insulating layer 83 to be exposed are formed in the first sealing layer 54 by patterning.

Figure 19:
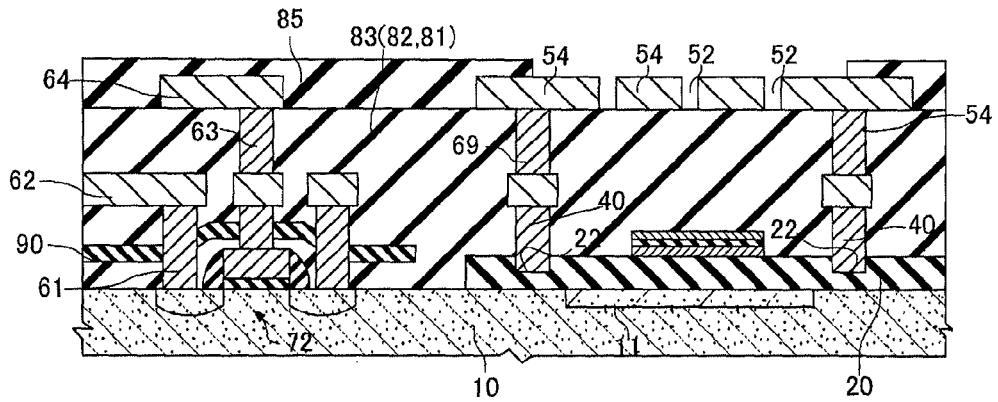
FIG. 19 is a schematic cross section in a step of the method for producing an electronic device according to an embodiment.
Figure 20:
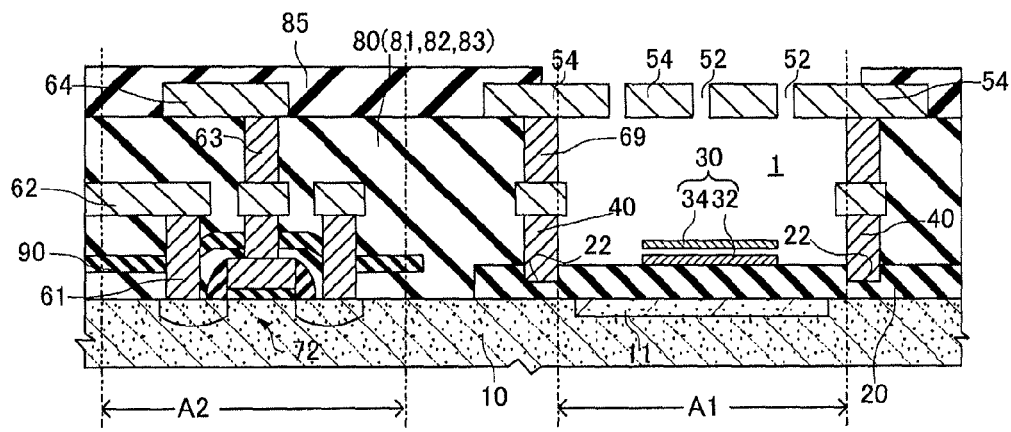
FIG. 20 is a schematic cross section in a step of the method for producing an electronic device according to an embodiment.

Next, as shown in FIG. 19, a protective layer 85 is formed. The protective layer 85 is, for example, silicon oxide, and can be formed by sputtering, CVD, or the like. Then, as shown in FIG. 20, the third insulating layer 83, the second insulating layer 82, the first insulating layer 81 and the sacrificial layer 33 that are surrounded by the surrounding wall 40, the interconnect 62, the guard ring 69 and the first sealing layer 54 are removed through the through-holes 52. More specifically, an etching gas or etching liquid is passed through the through-holes 52 to remove the third insulating layer 83, the second insulating layer 82, the first insulating layer 81 and the sacrificial layer 33 that are present in the region that will become a cavity 1, thereby forming a cavity 1 (in this specification, this step may be occasionally referred to as "release step", "release etching" or the like). The release step can be performed, for example, by wet etching using hydrofluoric acid, buffer hydrofluoric acid (a liquid mixture of hydrofluoric acid and ammonium fluoride) or the like, or dry etching using a hydrogen fluoride-based gas or the like. In this step, the underlayer 20 functions as an etching stopper layer. Through this step, a cavity 1 and a functional element 30 are formed in the first region A1 of the substrate 10.

With the production method according to the present embodiment, a part of the surrounding wall 40 is disposed so as to be embedded in the opening 22 of the underlayer 20. Thus, the etchant does not easily come in contact with the interface between the surrounding wall 40, which has relatively low corrosion resistance to the etchant, and the member located therebelow during release etching. Additionally, the aforementioned interface is formed so as to be bent in cross section. That is, a long path is provided for the etchant to erode the interface between the two members and leak to the outside of the cavity 1 during release etching. Accordingly, a large process margin (time margin) during release etching can be provided.

Then, as shown in FIG. 1, a second sealing layer 56 is formed on the first sealing layer 54. The second sealing layer 56 is formed, for example, by vapor deposition such as a sputtering method and a CVD method. By being formed by vapor deposition, the second sealing layer 56 is capable of sealing the through-holes 52. Furthermore, by being formed by vapor deposition, the second sealing layer 56 is capable of sealing the interior of the cavity 1 while it is in the depressurized state. Additionally, the protective layer 85 can be patterned as shown in FIG. 1 in order to establish electrical connection to the pad 64 and the like as needed. Then, the second sealing layer 56 is patterned by a photolithography technique and an etching technique to form a lid member 50, and thereby the electronic device 100 can be produced.

With the method for producing an electronic device according to the present embodiment, it is possible to produce an electronic device in which at least a part of the surrounding wall 40 forming the cavity 1 is embedded in the opening 22. Accordingly, it is possible to produce an electronic device for which high reliability is ensured. Furthermore, with the method for producing an electronic device according to the present embodiment, the interior of the cavity 1 is release etched while at least a part of the surrounding wall 40 forming the cavity 1 is being embedded in the opening 22, and therefore it is possible to sufficiently suppress the etchant from leaking to regions other than the cavity 1 during etching. This makes it possible to provide a large margin in the time management at least for release etching, thus increasing the production yield.

3. Oscillator

Figure 21:
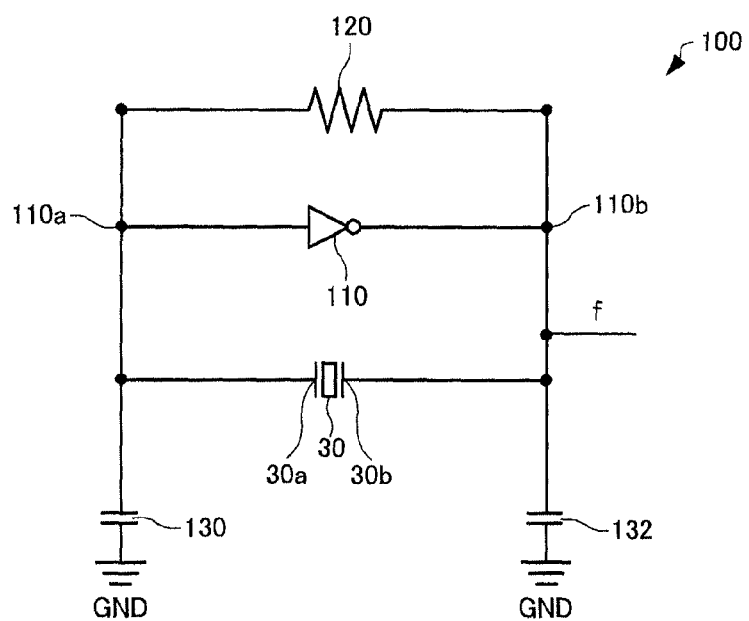
FIG. 21 is a circuit diagram showing an oscillator according to an embodiment.

Next, a description will be given of a case where the electronic device according to the present embodiment is an oscillator with reference to the drawings. The following describes a case where the electronic device 100 is an oscillator. FIG. 21 is a circuit diagram showing an electronic device (oscillator) 100 according to the present embodiment.

As shown in FIG. 21, the oscillator 100 includes a functional element (specifically, an MEMS vibrator) 30 and an inverting amplifier circuit 110.

The functional element 30 includes a first terminal 30a electrically connected to the fixed electrode 32 and a second terminal 30b electrically connected to the movable electrode 34. The first terminal 30a of the functional element 30 at least AC-connects to an input terminal 110a of the inverting amplifier circuit 110. The second terminal 30b of the functional element 30 at least AC-connects to an output terminal 110b of the inverting amplifier circuit 110.

Although the inverting amplifier circuit 110 is composed of a single inverter in the example shown, the inverting amplifier circuit 110 may be composed of a combination of a plurality of inverters (inverting circuits) or amplifying circuits so as to satisfy the desired oscillation conditions.

The oscillator 100 may include a feedback resistor for the inverting amplifier circuit 110. In the example shown in FIG. 21, the input terminal and the output terminal of the inverting amplifier circuit 110 are connected to each other via a resistor 120.

The oscillator 100 includes a first capacitor 130 connected between the input terminal 110a of the inverting amplifier circuit 110 and a reference potential (ground potential), and a second capacitor 132 connected between the output terminal 110b of the inverting amplifier circuit 110 and a reference potential (ground potential). This provides an oscillating circuit including a resonant circuit composed of the functional element 30 and the capacitors 130 and 132. The electronic device 100 outputs an oscillation signal f obtained by this oscillating circuit.

Figure 22:
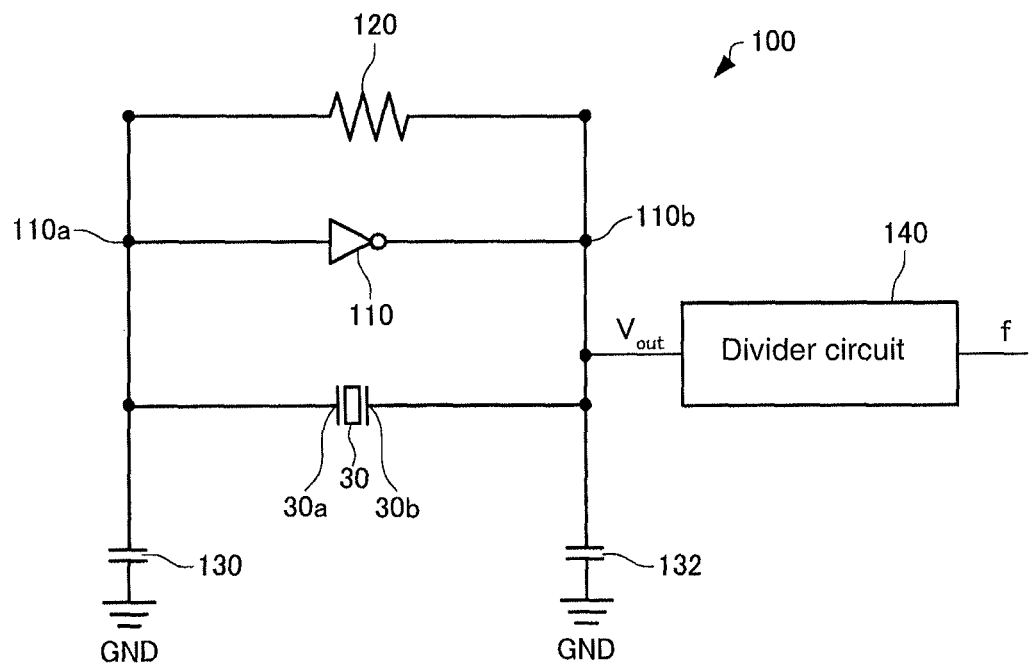
FIG. 22 is a circuit diagram showing an oscillator according to a modification of the embodiment.

As shown in FIG. 22, the oscillator 100 may further include a divider circuit 140. The divider circuit 140 divides the frequency of an output signal $V_{out}$ of the oscillating circuit and outputs an oscillation signal f. This enables the electronic device 100 to obtain, for example, an output signal having a lower frequency than the frequency of the output signal $V_{out}$. Note that the inverting amplifier circuit 110, the resistor 120, the capacitors 130 and 132, and the divider circuit 140 constitute a circuit unit 70 as shown in FIG. 1, for example.

The above-described embodiments and modifications are merely examples, and the invention is not limited thereto. For example, it is possible to combine the embodiments and the modifications as appropriate.

The invention is not limited to the above-described embodiments, and various additional embodiments may be made. For example, the invention includes a substantially identical configuration described in each of the embodiments (e.g., a configuration identical in the function, the method and the result, or a configuration identical in the advantage and the effect). The invention also includes a configuration in which nonessential components of the components described in the embodiments are replaced by other components. The invention also includes a configuration that has an operation and an effect that are identical to those described in the embodiments, or a configuration that achieves an identical advantage. The invention also includes a configuration to which a known technology has been added to each of the configurations described in the embodiments.

What is claimed is:

1. An electronic device comprising:
    a substrate;
    an underlayer having an opening and being formed on the substrate;
    a functional element provided on the underlayer; and
    a surrounding wall forming a cavity that accommodates the functional element, at least a part of the surrounding wall being disposed in the opening, wherein the surrounding wall has a lower surface made of a material containing titanium.

2. The electronic device according to claim 1,
    wherein the opening extends through the underlayer,
    the substrate includes a recessed portion at a position corresponding to the opening of the underlayer, and
    at least a part of the surrounding wall is disposed in the recessed portion.

3. The electronic device according to claim 1,
    wherein the lower surface of the surrounding wall has an asperity.

4. A method for producing an electronic device comprising:
    forming an underlayer on a substrate;
    forming a functional element on the underlayer;
    forming a transistor on the substrate;
    forming a first insulating layer that covers the functional element and the transistor;
    forming a corrosion-resistant layer that covers the first insulating layer;
    removing the corrosion-resistant layer on the underlayer;
    forming a second insulating layer that covers the corrosion-resistant layer and the first insulating layer;
    etching the second insulating layer to expose the corrosion-resistant layer above the transistor and etching the second insulating layer and the first insulating layer, thereby exposing the underlayer in a shape surrounding at least a part of the functional element;
    etching the exposed corrosion-resistant layer to expose the first insulating layer on the transistor and etching the exposed underlayer, thereby forming an opening in the underlayer;
    removing the first insulating layer on the transistor; and
    forming a conductive layer on the transistor and disposed in the opening, wherein the forming of the conductive layer includes forming a titanium layer of a lower surface of the conductive layer.

5. The method for producing an electronic device according to claim 4,
    wherein in the forming of an opening in the underlayer, the opening is caused to extend through the exposed underlayer and
    forming a recessed portion in the substrate at a position corresponding to the opening is further included, and
    in the forming of a conductive layer on the transistor and the opening, the conductive layer is formed on the recessed portion.

6. An oscillator comprising the electronic device according to claim 1, further comprising a circuit unit that drives the functional element.

7. An oscillator comprising the electronic device according to claim 2, further comprising a circuit unit that drives the functional element.

8. An oscillator comprising the electronic device according to claim 3, further comprising a circuit unit that drives the functional element.

9. An electronic device comprising:
    a substrate;
    an underlayer having an opening and being formed on the substrate;
    a functional element provided on the underlayer; and
    a surrounding wall forming a cavity that accommodates the functional element, at least a part of the surrounding wall being disposed in the opening,
    wherein a lower surface of the surrounding wall has an asperity.

10. The electronic device according to claim 9,
    wherein the opening extends through the underlayer,
    the substrate includes a recessed portion at a position corresponding to the opening of the underlayer, and
    at least a part of the surrounding wall is disposed in the recessed portion.

11. An oscillator comprising the electronic device according to claim 9, further comprising a circuit unit that drives the functional element.

12. An oscillator comprising the electronic device according to claim 10, further comprising a circuit unit that drives the functional element.

* * * * *